United States Patent
Park et al.

(10) Patent No.: US 11,097,211 B2
(45) Date of Patent: Aug. 24, 2021

(54) RESIST FILTERING SYSTEM HAVING MULTI FILTERS AND APPARATUS HAVING THE RESIST FILTERING SYSTEM

(71) Applicant: SAMSUNG ELECTRONICS CO., LTD., Suwon-si (KR)

(72) Inventors: Taehoi Park, Suwon-si (KR); Sangjin Kim, Suwon-si (KR); Nakhee Seong, Suwon-si (KR); Woojeong Shin, Suwon-si (KR); Taehwan Oh, Suwon-si (KR); Kwangsub Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/567,052

(22) Filed: Sep. 11, 2019

(65) Prior Publication Data

US 2020/0346143 A1   Nov. 5, 2020

(30) Foreign Application Priority Data

Apr. 30, 2019   (KR) .................. 10-2019-0050338

(51) Int. Cl.
*B01D 35/26*   (2006.01)
*B01D 36/00*   (2006.01)
*G03F 7/16*   (2006.01)

(52) U.S. Cl.
CPC ........... *B01D 35/26* (2013.01); *B01D 36/001* (2013.01); *G03F 7/16* (2013.01)

(58) Field of Classification Search
CPC .......... B01D 35/26; B01D 36/001; G03F 7/16
See application file for complete search history.

(56) References Cited

U.S. PATENT DOCUMENTS

| | | | |
|---|---|---|---|
| 6,238,576 B1 | 5/2001 | Yajima | |
| 7,195,122 B2 | 3/2007 | Hiranaga et al. | |
| 7,685,963 B2 | 3/2010 | Lee et al. | |
| 9,162,163 B2 | 10/2015 | Yoshida et al. | |
| 9,446,331 B2 | 9/2016 | Wang | |
| 10,014,285 B2 | 7/2018 | Kim et al. | |
| 10,074,546 B2 | 9/2018 | Terashita et al. | |
| 10,603,696 B2* | 3/2020 | Ogihara | C08G 77/04 |
| 2007/0207259 A1 | 9/2007 | Kulkarni et al. | |
| 2007/0272327 A1 | 11/2007 | Lin | |
| 2013/0108958 A1* | 5/2013 | Ogihara | G03F 7/004 430/270.1 |
| 2014/0034584 A1* | 2/2014 | Marumoto | H01L 21/6715 210/808 |
| 2014/0097147 A1* | 4/2014 | Yoshida | B01D 36/001 210/808 |

(Continued)

FOREIGN PATENT DOCUMENTS

CN   108610321 A   * 10/2018
CN   108791693 A   * 11/2018

OTHER PUBLICATIONS

English translation of CN-108610321-A.*

*Primary Examiner* — Joseph J Dallo
(74) *Attorney, Agent, or Firm* — Lee IP Law, P.C.

(57) ABSTRACT

A resist coating apparatus including a resist supplying system; a resist filtering system having a first filter, a second filter, and a pump between the first filter and the second filter; and a resist dispensing system, wherein the first filter includes a plurality of first unit filters connected in parallel.

17 Claims, 6 Drawing Sheets

(56) References Cited

U.S. PATENT DOCUMENTS

| | | | |
|---|---|---|---|
| 2014/0260963 A1* | 9/2014 | Wang | B01D 19/0063 95/8 |
| 2015/0000517 A1* | 1/2015 | Yoshihara | B01D 19/0031 95/1 |
| 2015/0125793 A1* | 5/2015 | Yoshihara | G03F 7/16 430/270.1 |
| 2015/0331322 A1* | 11/2015 | Carcasi | B05C 11/1013 222/1 |

* cited by examiner

RESIST FILTERING SYSTEM HAVING MULTI FILTERS AND APPARATUS HAVING THE RESIST FILTERING SYSTEM

CROSS-REFERENCE TO RELATED APPLICATION

Korean Patent Application No. 10-2019-0050338, filed on Apr. 30, 2019, in the Korean Intellectual Property Office, and entitled: "Resist Filtering System Having Multi Filters and an Apparatus Having the Resist Filtering System," is incorporated by reference herein in its entirety.

BACKGROUND

1. Field

Embodiments relate to a resist filtering system having multiple filters and an apparatus including the resist filtering system.

2. Description of the Related Art

Integration of a semiconductor device is gradually increasing, and a pattern is gradually becoming miniaturized. Fine patterns may be obtained by first forming elaborate resist patterns in a photolithography process.

SUMMARY

The embodiments may be realized by providing a resist coating apparatus including a resist supplying system; a resist filtering system having a first filter, a second filter, and a pump between the first filter and the second filter; and a resist dispensing system, wherein the first filter includes a plurality of first unit filters connected in parallel.

The embodiments may be realized by providing a resist coating apparatus including a resist supplying system; a resist filtering system including a first filter, a pump, and a second filter in series; and a resist dispensing system, wherein the second filter includes a plurality of unit filters connected in parallel.

The embodiments may be realized by providing a resist coating apparatus including a pre-filtering pipe; a post-filtering pipe; and a first filter, a pump, and a second filter in series between the pre-filtering pipe and the post-filtering pipe, wherein the first filter includes a plurality of first unit filters connected in parallel, and the second filter includes a plurality of second unit filters connected in parallel.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
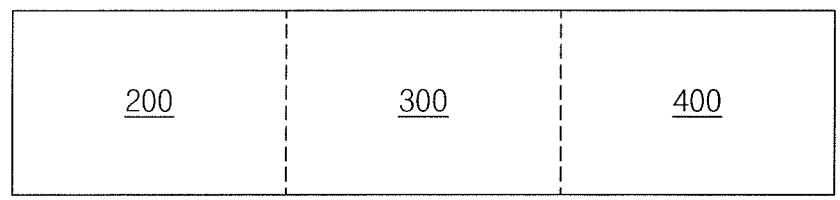
FIG. 1 illustrates a block diagram of a resist coating apparatus for manufacturing a semiconductor device according to an embodiment.

FIG. 1 illustrates a block diagram of a resist coating apparatus 100 for manufacturing a semiconductor device according to an embodiment. Referring to FIG. 1, the resist coating apparatus 100 according to the embodiment may include a resist supplying system 200, a resist filtering system 300, and a resist dispensing system 400. The resist supplying system 200 may provide a resist to the resist filtering system 300, and the resist filtering system 300 may provide the filtered resist to the resist dispensing system 400. The resist coating apparatus 100 may collectively include equipment for providing flowable materials such as a photoresist, an organic anti-reflection layer (ARL), color filters and micro-lenses of an image sensor, and other polymeric organic materials having suitable viscosity. In an implementation, the resist coating apparatus 100 may also include equipment for applying an inorganic material in a spin coating manner.

Figure 2:
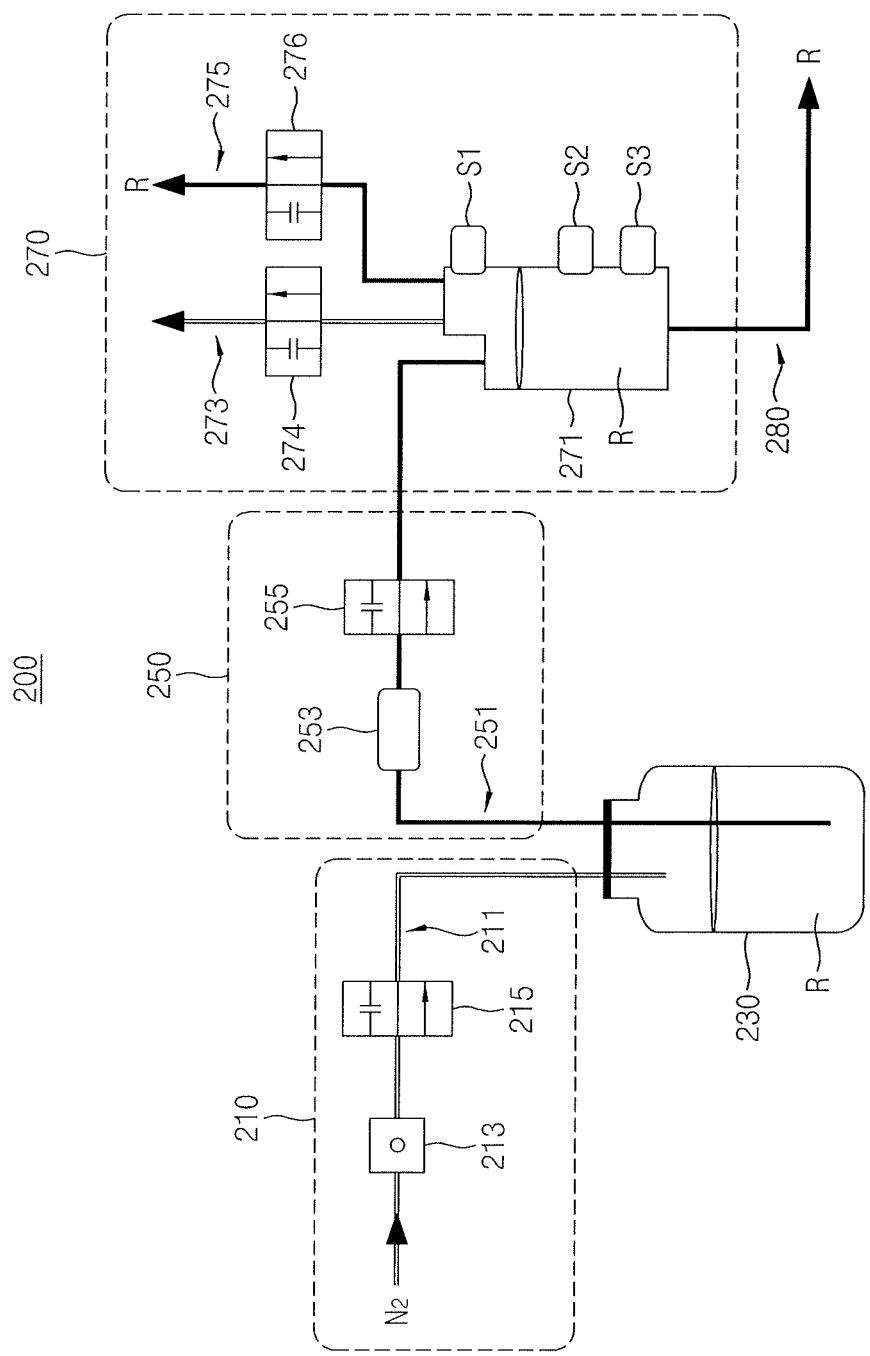
FIG. 2 illustrates a schematic diagram of a resist supplying system according to an embodiment.

FIG. 2 illustrates a schematic diagram of the resist supplying system according to an embodiment. Referring to FIG. 2, the resist supplying system 200 according to the embodiment may include an air inlet or gas inlet 210, a resist bottle or resist container 230, a resist outlet 250, and a resist reserve 270.

The gas inlet 210 may include a gas inlet pipe 211, a gas pressure regulator 213, and a gas shut-down valve 215. The gas pressure regulator 213 and the gas shut-down valve 215 may be at middle positions of the gas inlet pipe 211. A gas, e.g., nitrogen ($N_2$), may be provided in the resist container 230 through the gas inlet pipe 211. The gas inlet pipe 211 may be connected to a space in the resist container 230. The gas pressure regulator 213 may include at least one of a pump or a controller to supply gas into the resist container 230 at a constant pressure. For example, the gas pressure regulator 213 may regulate a gas pressure in the gas inlet pipe 211. The gas shut-down valve 215 may block a supply of gas from the gas pressure regulator 213 into the resist container 230. For example, when the resist container 230 needs to be replaced, the gas inlet pipe 211 needs be repaired or replaced, or another case in which a supply of gas should be blocked, the gas shut-down valve 215 may block the supply of gas.

The resist container 230 may be, e.g., a bottle or a barrel for accommodating a resist R. The resist container 230 may supply the resist R to the resist reserve 270 through the resist outlet 250 due to a pressure of the gas supplied to the gas inlet pipe 211 into the resist container 230.

The resist outlet 250 may include a resist outlet pipe 251, a resist sensor 253, and a resist shut-down valve 255. The resist outlet pipe 251 may provide a passage through which the resist R from the resist bottle 230 is transferred to the resist reserve 270. The resist sensor 253 and the resist shut-down valve 255 may be at middle positions of the resist outlet pipe 251. The resist sensor 253 may detect whether the resist R flows normally in the resist outlet pipe 251. If a foreign material, e.g., air or gas bubbles, instead of the resist R, were to be detected in the resist outlet pipe 251, the resist sensor 253 may generate an alarm. The resist shut-down valve 255 may block a supply of the resist R in the resist outlet pipe 251 to the resist reserve 270. For example, when the resist reserve 270 needs to be replaced, repaired, or cleaned, the resist outlet pipe 251 needs to be repaired or replaced, or a supply of another resist R should be blocked, the resist shut-down valve 255 may block the supply of the resist R.

The resist reserve 270 may include a reservoir 271, a gas vent pipe 273, a resist overflow pipe 275, and a pre-filtering pipe 280.

The reservoir 271 may be connected to the resist outlet pipe 251 to temporarily store the resist R. The reservoir 271 may include a high level sensor S1, a low level sensor S2, and an empty sensor S3. The high level sensor S1 and the low level sensor S2 may detect whether the reservoir 271 is sufficiently filled with the resist R. For example, when the high level sensor S1 detects the resist R, the high level sensor S1 may generate an alarm. When the high level sensor S1 generates an alarm, the resist shut-down valve 255 may block a flow of the resist R in the resist outlet pipe 251. For example, the resist R may not be supplied to the reservoir 271. When either of the low level sensor S2 and the empty sensor S3 detects air or gas, the low level sensor S2 and the empty sensor S3 may generate an alarm, respectively. When the low level sensor S2 generates an alarm, the resist R may be supplied from the resist container 230 to the reservoir 271. In this case, the resist shut-down valve 255 may remain in an opened state. For example, in a steady state, a surface of the resist R may be located between the high level sensor S1 and the low level sensor S2. When the empty sensor S3 generates an alarm, the resist R may be determined as not being supplied from the resist container 230 to the reservoir 271. For example, when the empty sensor S3 generates the alarm, the resist container 230 may be replaced with a new one or refilled, or an entirety of the resist supplying system 200 may be checked.

The gas in the reservoir 271 may be exhausted through the gas vent pipe 273. A gas vent shut-down valve 274 may be at a middle position of the gas vent pipe 273. The gas vent shut-down valve 274 may perform an opening or closing operation to selectively exhaust the gas from the reservoir 271.

An excess of the resist R in the reservoir 271 may be exhausted through the resist overflow pipe 275. For example, if the resist R were to be excessively supplied into the reservoir 271, the resist R may be exhausted to the outside through the resist overflow pipe 275. The resist overflow pipe 275 may include a resist shut-down valve 276. The resist shut-down valve 276 may perform an opening or closing operation to allow the excess of the resist R in the reservoir 271 to be selectively exhausted.

The resist R in the reservoir 271 may be provided to the resist filtering system 300 through a first transfer pipe 280, e.g., the pre-filtering pipe 280.

Figure 3:
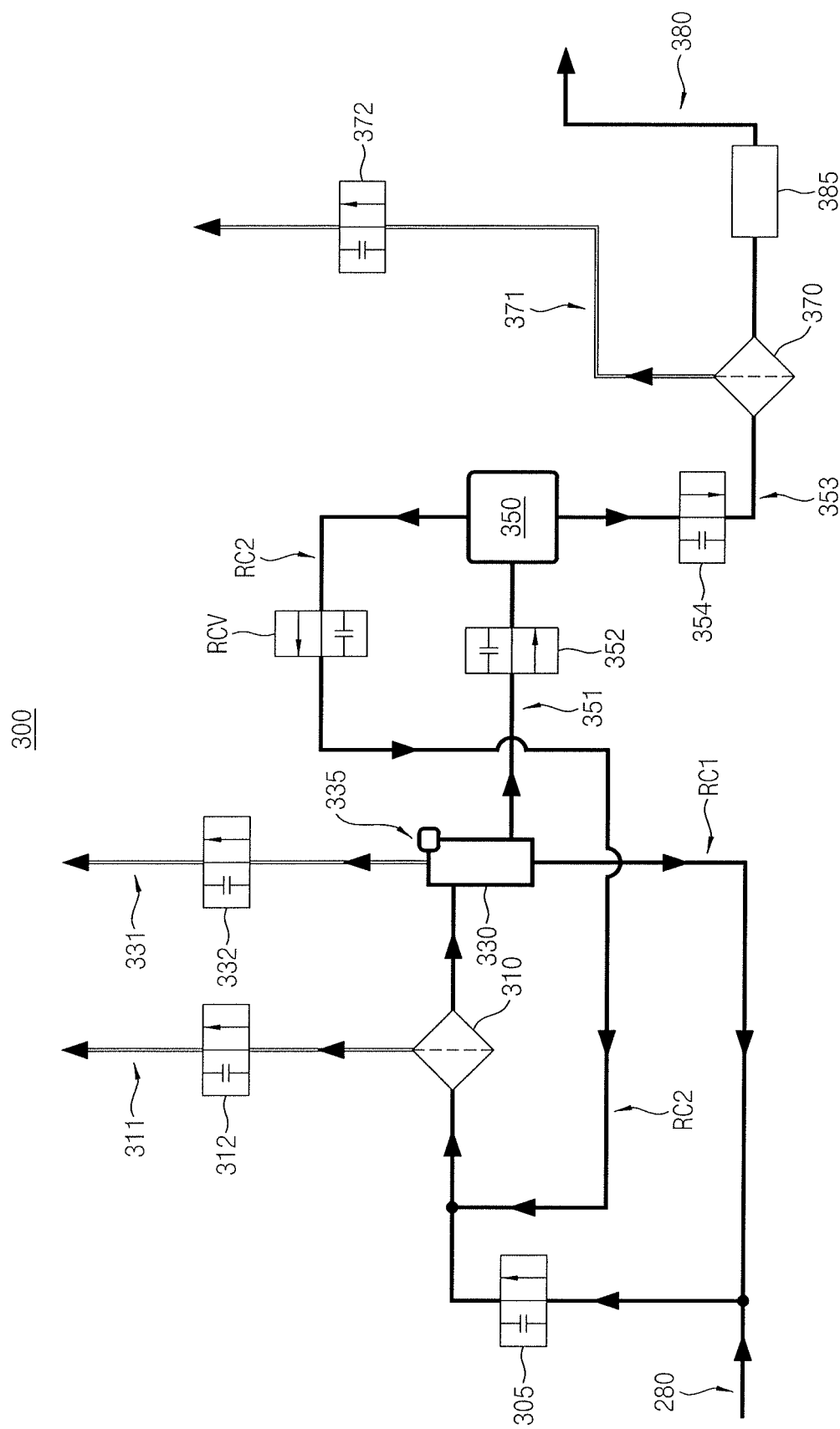
FIG. 3 illustrates a schematic diagram of a resist filtering system according to an embodiment.

FIG. 3 illustrates a schematic diagram of the resist filtering system 300 according to an embodiment. Referring to FIG. 3, the resist filtering system 300 according to the embodiment may include, e.g., a first filter 310, a bubble trap 330, a pump 350, and a second filter 370. The first filter 310 may primarily filter the resist R provided from the pre-filtering pipe 280 to provide the filtered resist R to the bubble trap 330. The bubble trap 330 may remove bubbles from the filtered resist R (provided from the first filter 310) to provide the resist R to the pump 350. The pump 350 may provide the second filter 370 with the resist R from the bubble trap 330. The second filter 370 may provide the resist R from the pump 350 to the resist dispensing system 400 through a second transfer pipe 380, e.g., a post-filtering pipe 380.

The pre-filtering pipe 280 may include a pre-filtering valve 305. The pre-filtering valve 305 may block a flow of the resist R from the resist supplying system 200 to the first filter 310 of the resist filtering system 300. If the first filter 310 needs to be repaired or replaced, or in other cases, the pre-filtering valve 305 may block the flow of the resist R in the pre-filtering pipe 280.

The first filter 310 may filter polar foreign materials from the resist R. In an implementation, the first filter 310 may include a polar filter, e.g., a de-ionizing filter, for removing ionized foreign materials, electrostatic foreign materials, or other foreign materials having polarity. In an implementation, the first filter 310 may remove a gas from the resist R. The polar foreign materials and/or gas removed from the filtered resist R may be exhausted (e.g., to the outside) through a first exhaust pipe 311. The first exhaust pipe 311 may include a first exhaust shut-down valve 312. The first exhaust shut-down valve 312 may selectively open or close the first exhaust pipe 311 to facilitate an operation of the first filter 310.

The bubble trap 330 may remove bubbles present in the resist R and pipes. Bubbles could occur in the resist R while passing through the first filter 310. In an implementation, bubbles unfiltered in the first filter 310 may be present in the pipes. The bubble trap 330 may include a bubble sensor 335. For example, when the bubble sensor 335 detects bubbles, the bubble trap 330 may trap the detected bubbles to exhaust the trapped bubbles (e.g., to the outside). For example, the bubble sensor 335 may include an air or gas sensor. The bubbles trapped in the bubble trap 330 may be exhausted along a bubble exhaust pipe 331. The bubble exhaust pipe 331 may include a bubble exhaust shut-down valve 332. The bubble exhaust shut-down valve 332 may selectively open or close the bubble exhaust pipe 331 to facilitate an operation of the bubble trap 330.

The pump 350 may suction or move the resist R from the first filter 310 and the bubble trap 330 to provide the resist R to the second filter 370. For example, the pump 350 may include a pneumatic pump. In an implementation, the pump 350 may perform an expanding (inflating) operation to suction the resist R from the first filter 310 and the bubble trap 330, and may perform a compressing (contracting) operation to provide the suctioned resist R to the second filter 370.

The second filter 370 may filter non-polar foreign materials from the resist R. In an implementation, the second filter 370 may filter solidified particles or clumps, or other non-polar foreign materials. In an implementation, the second filter 370 may include a non-polar filter (e.g., particle removal filter) to remove non-polar foreign materials (e.g., particles). The non-polar foreign materials filtered from the filtered resist R may be exhausted or otherwise removed (e.g., to the outside) through a second exhaust pipe 371. The second exhaust pipe 371 may include a second exhaust shut-down valve 372. The second exhaust shut-down valve 372 may selectively open or close the second exhaust pipe 371 to facilitate an operation of the second filter 370.

The second transfer pipe 380, e.g., the post-filtering pipe 380, may include a flow meter 385. The flow meter 385 may measure a flow rate of the resist R from the second filter 370 to the resist dispensing system 400 through the post-filtering pipe 380. The measured flow rate may be considered for adjusting a pumping pressure of the pump 350. In an implementation, the flow meter 385 may include a valve for selectively blocking a flow of the resist R in the post-filtering pipe 380.

The resist filtering system 300 may include a pre-pump transfer pipe 351 for transferring the resist R from the bubble trap 330 to the pump 350, and a post-pump transfer pipe 353 for transferring the resist R from the pump 350 to the second filter 370. The pre-pump transfer pipe 351 may include a pre-pump valve 352, and the post-pump transfer pipe 353 may include a post-pump valve 354. The pre-pump valve 352 may block the resist R from being transferred from the first filter 310 and the bubble trap 330 to the pump 350, and the post-pump valve 354 may block the resist R from being transferred from the pump 350 to the second filter 370.

The resist filtering system 300 may further include a bubble trap recycling pipe RC1 for returning the resist R from the bubble trap 330 to the first transfer pipe 280, e.g., the pre-filtering pipe 280, ahead of the first filter 310, and a pump recycling pipe RC2 for returning the resist R from the pump 350 to the first transfer pipe 280, e.g., the pre-filtering pipe 280, ahead of the first filter 310. For example, an excess or surplus of the resist R from the bubble trap 330 may be returned to the pre-filtering pipe 280 through the bubble trap recycling pipe RC1. The bubble trap recycling pipe RC1 may transfer the resist R from which bubbles have been removed. In an implementation, an excessi or surplus of the resist R from the pump 350 may be returned to the first transfer pipe 280, e.g., the pre-filtering pipe 280, through the pump recycling pipe RC2.

In an implementation, as illustrated in FIG. 3, the bubble trap recycling pipe RC1 may be connected to the pre-filtering pipe 280 ahead of the pre-filtering valve 305, and the pump recycling pipe RC2 may be connected to the pre-filtering pipe 280 behind or past the pre-filtering valve 305. In an implementation, the bubble trap recycling pipe RC1 may be connected to the pre-filtering pipe 280 behind or past the pre-filtering valve 305, or the pump recycling pipe RC2 may be connected to the pre-filtering pipe 280 ahead of the pre-filtering valve 305. In an implementation, as illustrated in FIG. 3, the pump recycling pipe RC2 may be connected to the pre-filtering pipe 280 behind or past the pre-filtering valve 305, and a pump recycling valve RCV may be at a middle position of the pump recycling pipe RC2. The pump recycling valve RCV may block a flow of the resist R from the pump 350 to the pre-filtering pipe 280. In an implementation, the bubble trap recycling pipe RC1 may be connected to the pre-filtering pipe 280 behind or past the pre-filtering valve 305, and an additional valve may be at a middle position of the bubble trap recycling pipe RC1.

In an implementation, both of the bubble trap recycling pipe RC1 and the pump recycling pipe RC2 may be connected to the pre-filtering pipe 280 ahead of the pre-filtering valve 305. For example, the pump recycling valve RCV may be omitted. In an implementation, both of the bubble trap recycling pipe RC1 and the pump recycling pipe RC2 may be connected to the pre-filtering pipe 280 behind or past the pre-filtering valve 305. For example, the bubble trap recycling pipe RC1 may independently include a shut-down valve.

In an implementation, the first filter 310 may include a non-polar filter, and the second filter 370 may include a polar filter. For example, a characteristic of the first filter 310 may be exchanged with that of the second filter 370.

Figure 4:
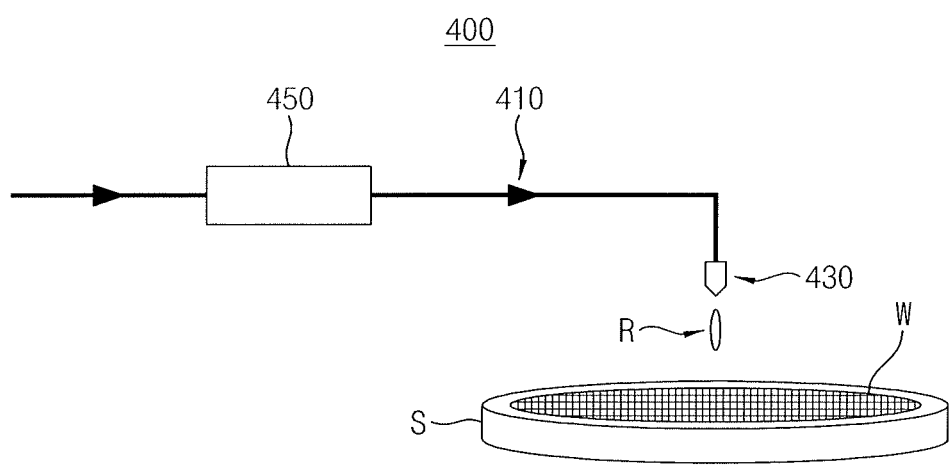
FIG. 4 illustrates a schematic diagram of resist dispensing system according to an embodiment.

FIG. 4 illustrates a schematic diagram of the resist dispensing system 400 according to an embodiment. Referring to FIG. 4, the resist dispensing system 400 according to the embodiment may include a dispensing pipe 410 and a dispensing system 430. The dispensing pipe 410 may be connected to the post-filtering pipe 380 of the resist filtering system 300. The dispensing pipe 410 may include a dispensing controller 450. The dispensing controller 450 may control the resist R dispensed from the dispensing system 430 onto a wafer W. For example, the dispensing controller 450 may perform a pressing operation such as squeezing. The dispensing system 430 may dispense the resist R onto the wafer W seated on a stage S under the control of the dispensing controller 450. The stage S may include an electrostatic chuck (ESC) or a vacuum chuck.

FIGS. 5A to 5D illustrate simplified diagrams of examples of the resist filtering system 300 according to various embodiments. For example, the first filter 310, the bubble trap 330, the pump 350, and the second filter 370 of FIG. 3 are representatively illustrated and described. Although not illustrated in FIGS. 5A to 5D, it should be understood that all of other components may be included with reference to FIGS. 2 to 4.

Figure 5A:
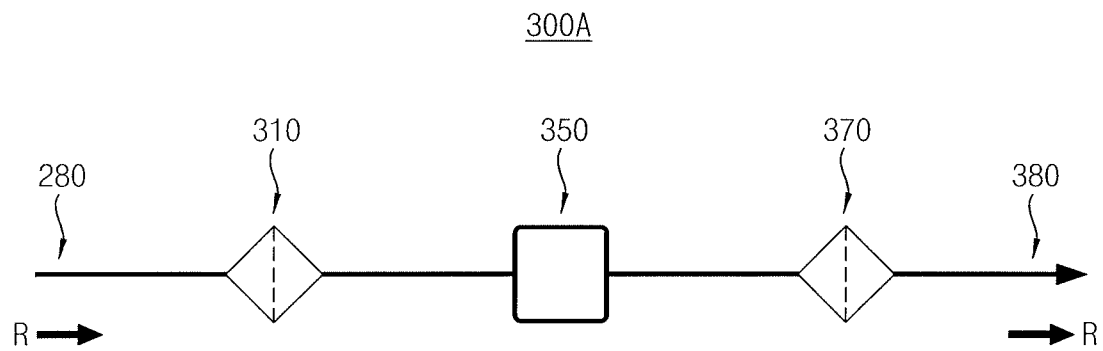
FIGS. 5A to 5D illustrate simplified diagrams of examples of the resist filtering system according to various embodiments.

Referring to FIG. 5A, a resist filtering system 300A according to an embodiment may include a first filter 310, a second filter 370, and a pump 350 between the first filter 310 and the second filter 370. The first filter 310, the pump 350, and the second filter 370 may be connected in series between the first transfer pipe 280 and the post-filtering pipe 380. For example, the first filter 310 may include a polar filter (for removing polar foreign materials from the resist R), and the second filter 370 may include a non-polar filter (for removing non-polar foreign materials from the resist R). In an implementation, the first filter 310 may include a non-polar filter (for removing non-polar foreign materials from the resist R), and the second filter 370 may include a polar filter (for removing polar foreign materials from the resist R). If polar foreign materials and non-polar foreign materials were filtered without discrimination (e.g., with a single filter), filtering efficiency for both of the polar foreign materials and the non-polar foreign materials could be degraded. The first filter 310 may be designed to be dedicated to filtering (e.g., only) polar foreign materials, and the second filter 370 is designed to be dedicated to filtering (e.g., only) non-polar foreign materials such that the filtering efficiency may be improved significantly. A filtering effect for the foreign materials in the resist filtering system 300A according to an embodiment may be increased significantly.

In an implementation, the resist filtering system 300A may further include a bubble trap (330 of FIG. 3) between the first filter 310 and the pump 350. As described above, the bubble trap 330 may remove bubbles from the resist R, which has passed through the first filter 310. In an implementation, in order to remove bubbles from pipes, other bubble traps may be additionally provided at various positions in the resist filtering system 300A.

Figure 5B:
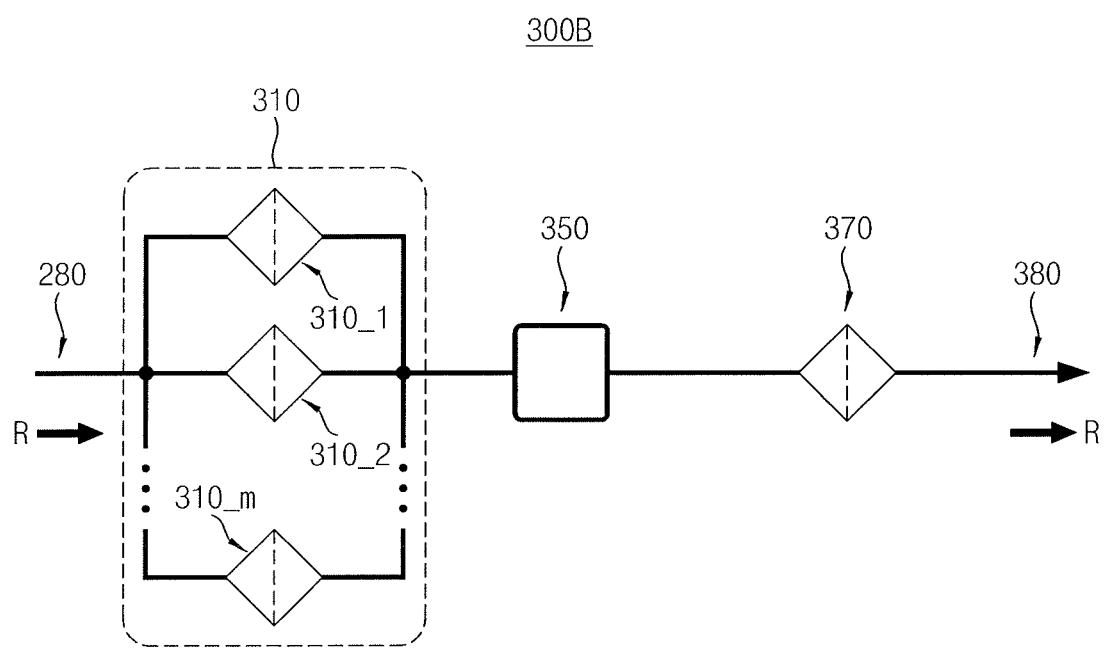

Referring to FIG. 5B, a resist filtering system 300B according to an embodiment may include a first filter 310 having a plurality of first unit filters $310\_1$ to $310\_m$ (in which m is a natural number), a second filter 370, and a pump 350 (between the first filter 310 and the second filter 370). The plurality of first unit filters $310\_1$ to $310\_m$ may be connected in parallel between the pre-filtering pipe 280 and the pump 350. The plurality of first unit filters $310\_1$ to $310\_m$ may be connected in parallel, and a pressure in the pre-filtering pipe 280 due to the pump 350 may be distributed. For example, owing to a distributed low pressure, a resist R may (e.g., relatively) slowly pass through the first unit filters $310\_1$ to $310\_m$. According to the number of the plurality of first unit filters $310\_1$ to $310\_m$, a pressure difference of the resist R in the first filter 310 may be controlled. The resist R may be controlled to pass through the plurality of first unit filters $310\_1$ to $310\_m$ at an appropriate pressure and an appropriate speed, and a filtering effect of the first filter 310 may be improved. If the resist R were to pass through the plurality of first unit filters $310\_1$ to $310\_m$ at too strong or high of a pressure, i.e., at a very high speed, polar foreign materials may not be sufficiently filtered. If the resist R were to pass through the plurality of first unit filters 310_1 to 310_m at too weak or low of a pressure, i.e., at a very slow speed (e.g., even slower than desired), productivity may be degraded and more residues could occur due to slow fluidity. The plurality of first unit filters 310_1 to 310_m may include polar filters, and the second filter 370 may include a non-polar filter. In an implementation, the plurality of first unit filters 310_1 to 310_m may include non-polar filters, and the second filter 370 may include a polar filter. In an implementation, the resist filtering system 300B may further include a bubble trap (330 of FIG. 3) between the first filter 310 and the pump 350.

Figure 5C:
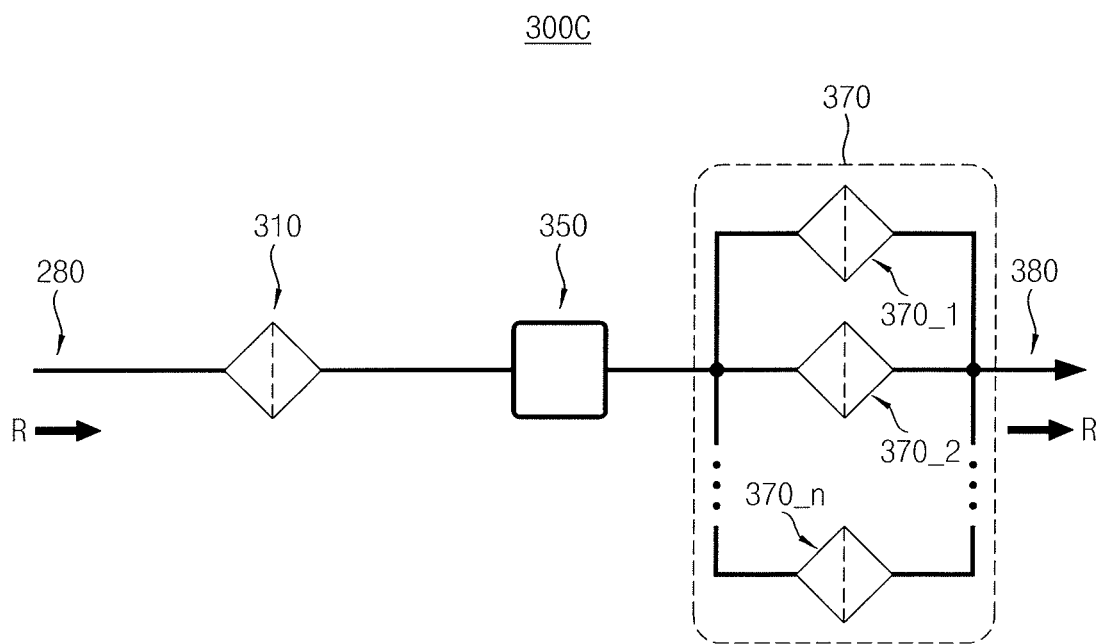

Referring to FIG. 5C, a resist filtering system 300C according to an embodiment may include a first filter 310, a second filter 370 having a plurality of second unit filters 370_1 to 370_n (in which n is a natural number), and a pump 350 (between the first filter 310 and the second filter 370). The plurality of second unit filters 370_1 to 370_n may be connected in parallel between the pump 350 and a post-filtering pipe 380. The plurality of second unit filters 370_1 to 370_n may be connected in parallel, and a pressure in the post-filtering pipe 380 due to the pump 350 may be distributed. For example, owing to a distributed low pressure, a resist R may pass through the second unit filters 370_1 to 370_n (e.g., relatively) slowly. According to the number of the plurality of second unit filters 370_1 to 370_n, a pressure difference of the resist R in the second filter 370 may be controlled. The resist R may be controlled to pass through the plurality of second unit filters 370_1 to 370_n at an appropriate pressure and an appropriate speed, and a filtering effect of the second filter 370 may be improved. If the resist R were to pass through the plurality of second unit filters 370_1 to 370_n at too higher or too strong of a pressure, i.e., at a very high speed, polar foreign materials may not be sufficiently filtered. If the resist R were to pass through the plurality of second unit filters 370_1 to 370_n at too weak or too low of a pressure, i.e., at a very slow speed (e.g., even slower than desired), productivity may be degraded and more residues could occur due to slow fluidity. The first filter 310 may include a polar filter, and the plurality of second unit filters 370_1 to 370_n may include non-polar filters. In an implementation, the first filter 310 may include a non-polar filter, and the plurality of second unit filters 370_1 to 370_n may include polar filters. In an implementation, the resist filtering system 300C may further include a bubble trap (330 of FIG. 3) between the first filter 310 and the pump 350.

Figure 5D:
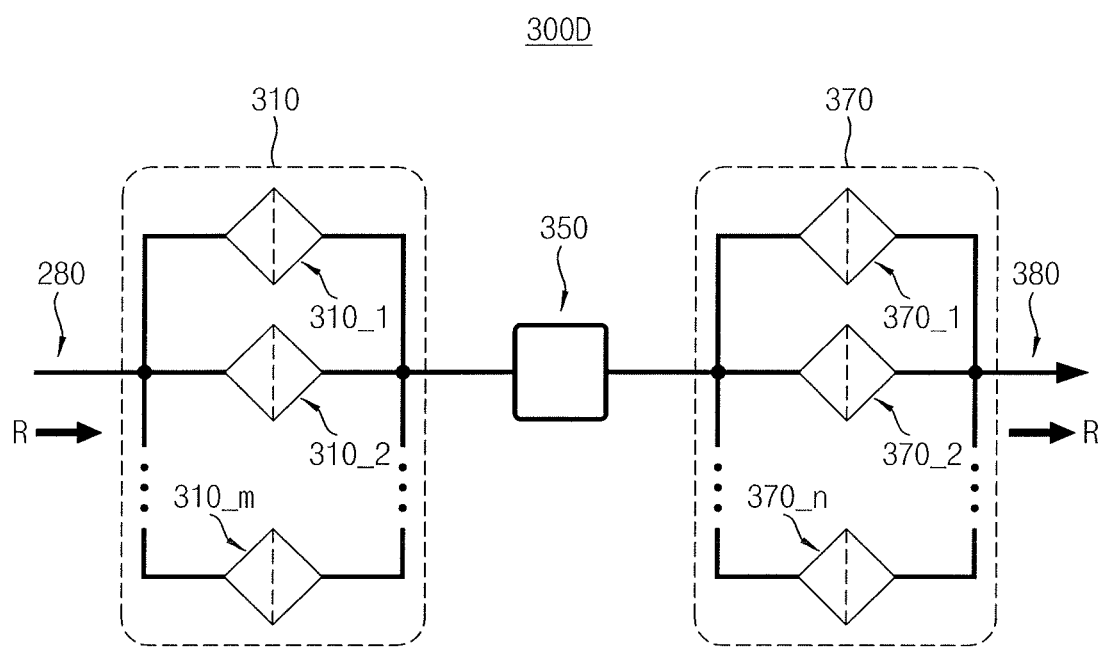

Referring to FIG. 5D, a resist filtering system 300D according to an embodiment may include a first filter 310 having a plurality of first unit filters 310_1 to 310_m, a second filter 370 having the plurality of second unit filters 370_1 to 370_n, and a pump 350 (between the first filter 310 and the second filter 370). The plurality of first unit filters 310_1 to 310_m may be connected in parallel between the pre-filtering pipe 280 and the pump 350. The plurality of second unit filters 370_1 to 370_n may be connected in parallel between the pump 350 and the post-filtering pipe 380. The plurality of first unit filters 310_1 to 310_m may be connected in parallel, and a pressure in the pre-filtering pipe 280 due to the pump 350 may be distributed. The plurality of second unit filters 370_1 to 370_n may be connected in parallel, and a pressure in the post-filtering pipe 380 due to the pump 350 may be distributed. In an implementation, the resist filtering system 300C may further include a bubble trap (330 of FIG. 3) between the first filter 310 and the pump 350.

In the embodiments, the resist filtering system 300 and the resist filtering systems 300A to 300D of the resist coating apparatus 100 may each include only one pump 350. If a plurality of pumps were to be included in the resist filtering system, pumping pressures of each of the pumps may need to be adjusted to match each other. For example, a passage pressure of the first filter may match that of the second filter, and a resist dispensing pressure of the first filter may also match that of the second filter. If pressures of the resist in the pre-filtering pipe, the first filter, the bubble trap, the second filter, the post-filtering pipe, the dispensing pipe, and the dispensing system were to be controlled using separate pumps, variables due to the separate pumps could increase such that it is difficult to uniformly perform a process. In an implementation, only one pump 350 may be employed in the apparatus, and all pressures of the resist R in the system may be uniformly controlled. In an implementation, the plurality of first unit filters 310_1 to 310_m and the plurality of second unit filters 370_1 to 370_n, which are connected in parallel, may distribute the pressure of the pump 350. For example, the number of the plurality of first unit filters 310_1 to 310_m and the number of the plurality of second unit filters 370_1 to 370_n may be independently adjusted such that the resist pressures in the first filter 310 and the second filter 370 may be appropriately controlled.

By way of summation and review, elaborate resist patterns may be obtained from extremely pure resists, and techniques for filtering impurities in a resist may be important.

According to an embodiment, polar foreign materials and non-polar foreign materials, which could be present in a resist, may be independently filtered so that a filtering effect can be improved.

According to an embodiment, a plurality of unit filters may be connected in parallel and may distribute a pressure in a resist transfer pipe so that the filtering effect may be improved.

One or more embodiments may provide a resist filtering system having multiple filters so as to obtain an extremely pure resist.

One or more embodiments may provide maximization in filtering efficiency by individually filtering a polar impurity and a non-polar impurity in a resist.

One or more embodiments may provide a resist filtering system with a filter including a plurality of unit filters connected in parallel and a resist coating apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A resist coating apparatus, comprising:
a resist supplying system;
a resist filtering system having a first filter, a second filter, and a pump between the first filter and the second filter; and
a resist dispensing system, wherein one of the first filter and the second filter includes a polar filter to remove polar foreign materials, and wherein the resist filtering system further includes a bubble trap between the first filter and the pump.

2. The resist coating apparatus as claimed in claim 1, wherein the polar filter includes a de-ionizing filter.

3. The resist coating apparatus as claimed in claim 1, wherein:

the first filter includes a plurality of first unit filters connected in parallel, and the second filter includes a plurality of second unit filters connected in parallel.

4. The resist coating apparatus as claimed in claim 3, wherein each second unit filter of the plurality of second unit filters includes a non-polar filter to remove non-polar foreign materials.

5. The resist coating apparatus as claimed in claim 4, wherein the second filter includes a particle removal filter.

6. The resist coating apparatus as claimed in claim 1, further comprising:

a pre-filtering pipe connecting the resist supplying system to the resist filtering system; and a post-filtering pipe connecting the resist filtering system to the resist dispensing system, wherein the first filter, the pump, and the second filter are in series between the pre-filtering pipe and the post-filtering pipe.

7. The resist coating apparatus as claimed in claim 6, wherein the resist filtering system further includes a bubble trap recycling pipe connected between the bubble trap and the pre-filtering pipe.

8. The resist coating apparatus as claimed in claim 7, wherein:

the pre-filtering pipe includes a pre-filtering valve; and the bubble trap recycling pipe is connected to the pre-filtering pipe ahead of the pre-filtering valve.

9. The resist coating apparatus as claimed in claim 8, wherein the resist filtering system further includes a pump recycling pipe connected between the pump and the pre-filtering pipe.

10. The resist coating apparatus as claimed in claim 9, wherein the pump recycling pipe is connected to the pre-filtering pipe past the pre-filtering valve.

11. The resist coating apparatus as claimed in claim 9, wherein the pump recycling pipe includes a pump recycling valve.

12. The resist coating apparatus as claimed in claim 6, wherein:

the resist supplying system includes a gas inlet, a resist container, a resist outlet, and a resist reserve;

the resist reserve includes a reservoir, a gas vent pipe connected to the reservoir, and a resist overflow pipe; and the reservoir is connected to the pre-filtering pipe.

13. The resist coating apparatus as claimed in claim 12, wherein the gas inlet includes:

a gas inlet pipe;

a gas pressure regulator to regulate a pressure of gas in the gas inlet pipe; and a gas shut-down valve to block the gas in the gas inlet pipe.

14. The resist coating apparatus as claimed in claim 12, wherein the reservoir includes a high level sensor, a low level sensor, and an empty sensor.

15. The resist coating apparatus as claimed in claim 12, wherein the resist outlet includes a resist outlet pipe, a resist sensor, and a resist shut-down valve.

16. A resist coating apparatus, comprising:

a resist supplying system;

a resist filtering system including a first filter, a pump, and a second filter in series; and a resist dispensing system, wherein:

at least one of the first filter and the second filter include a plurality of unit filters connected in parallel, and each unit filter of the plurality of unit filters includes a non-polar filter to remove non-polar foreign materials.

17. A resist coating apparatus, comprising:

a pre-filtering pipe;

a post-filtering pipe; and a first filter, a pump, and a second filter in series between the pre-filtering pipe and the post-filtering pipe, wherein:

the first filter includes a plurality of first unit filters connected in parallel, the second filter includes a plurality of second unit filters connected in parallel, each first unit filter of the plurality of first unit filters includes a polar filter, and each second unit filter of the plurality of second unit filters includes a non-polar filter.

* * * * *